United States Patent
Wu et al.

(10) Patent No.: US 7,129,559 B2
(45) Date of Patent: Oct. 31, 2006

(54) HIGH VOLTAGE SEMICONDUCTOR DEVICE UTILIZING A DEEP TRENCH STRUCTURE

(75) Inventors: Chen-Bau Wu, Zhubei (TW); Shun-Liang Hsu, Hsin-Chu (TW); You-Kuo Wu, Sijhih (TW); Yu-Chang Jong, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 37 days.

(21) Appl. No.: 10/821,432

(22) Filed: Apr. 9, 2004

(65) Prior Publication Data

US 2005/0224896 A1    Oct. 13, 2005

(51) Int. Cl.
*H01L 29/00* (2006.01)
(52) U.S. Cl. .............. 257/510; 257/501; 257/506; 257/E29.007; 257/E29.02; 257/E21.545
(58) Field of Classification Search ............... 257/499, 257/510, 408, 511, 512
See application file for complete search history.

(56) References Cited

U.S. PATENT DOCUMENTS

| | | | |
|---|---|---|---|
| 6,114,741 A * | 9/2000 | Joyner et al. ............... 257/506 |
| 6,172,401 B1 * | 1/2001 | Brand .......................... 257/344 |
| 6,495,898 B1 * | 12/2002 | Iwamatsu et al. ........... 257/506 |
| 6,501,149 B1 | 12/2002 | Hong | |
| 2001/0035774 A1 * | 11/2001 | Kotani ........................ 326/120 |
| 2002/0038901 A1 * | 4/2002 | Kuroi et al. ................. 257/510 |
| 2003/0006476 A1 * | 1/2003 | Chen et al. .................. 257/510 |
| 2003/0107103 A1 * | 6/2003 | Iwata et al. .................. 257/506 |
| 2003/0155592 A1 * | 8/2003 | Shima et al. ................ 257/288 |
| 2003/0211663 A1 * | 11/2003 | Min et al. .................... 438/148 |
| 2004/0029355 A1 * | 2/2004 | Hara et al. ................... 438/435 |

* cited by examiner

*Primary Examiner*—Jerome Jackson
*Assistant Examiner*—Paul Budd
(74) *Attorney, Agent, or Firm*—Haynes and Boone, LLP

(57) ABSTRACT

A semiconductor device includes a substrate having a source, a drain, and a gate between the source and the drain. Both the source and the drain include a first edge, and the gate includes a first portion. A first deep trench structure is situated under the first portion of the gate and proximate to the first edge of the source and the first edge of the drain.

9 Claims, 3 Drawing Sheets

HIGH VOLTAGE SEMICONDUCTOR DEVICE UTILIZING A DEEP TRENCH STRUCTURE

BACKGROUND

The present disclosure relates generally to semiconductor devices and, more specifically, to a high voltage semiconductor device utilizing a deep trench isolation structure.

As field effect transistors (FET's) such as metal-oxide-semiconductor (MOS) devices are adopted for higher and higher power or voltage applications, problems arise with respect to the current vs. voltage response of the device.

In MOS devices, such as high voltage lateral diffused metal-oxide semiconductor (HVLDMOS) structures, the gate electrode typically may overlap the non-active region due to processing and design issues. When a high enough voltage is applied to the gate, a channel in the non-active region may open up, allowing a leakage current to flow through it, which causes the device's current vs. voltage response to deviate from the desired linear relationship.

Accordingly, it would be desirable to provide an improved high voltage semiconductor device and method of manufacture thereof absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
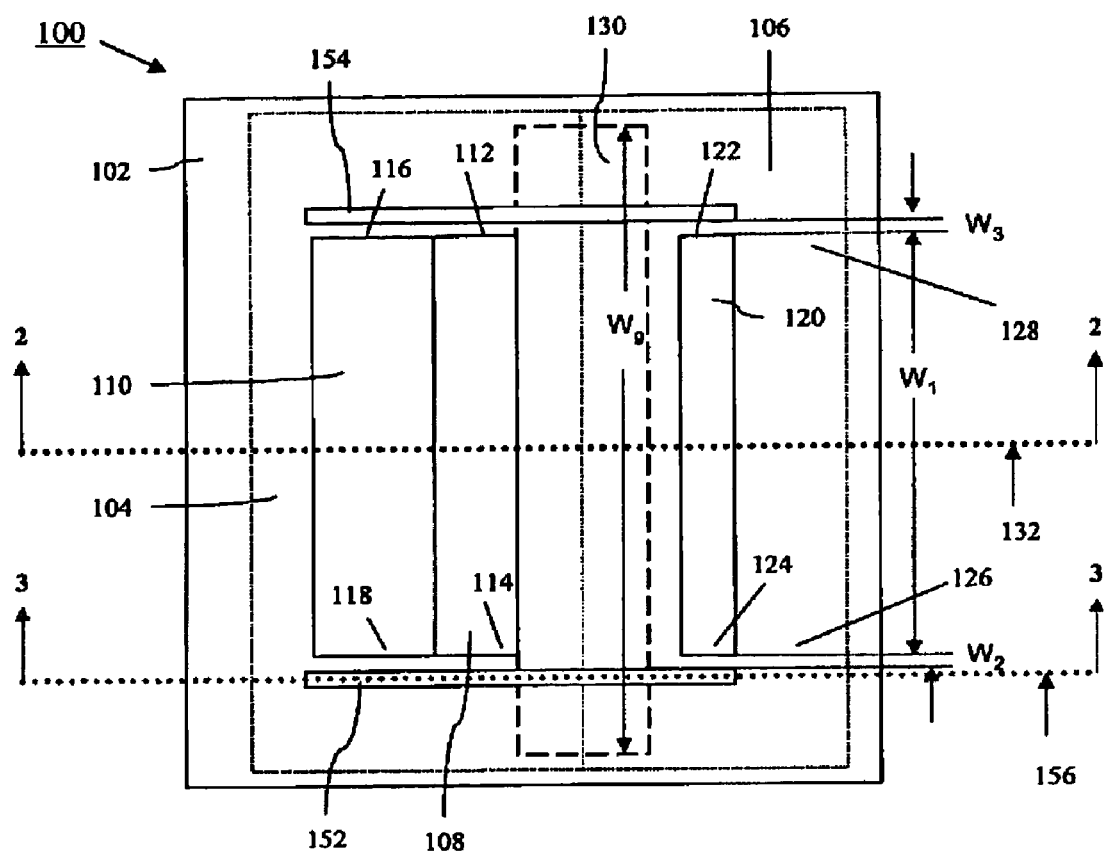
FIG. 1 is a top view illustrating an embodiment of a high voltage semiconductor device constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

In one embodiment, a high voltage semiconductor device 100, FIG. 1, includes a substrate 102. Substrate 102 may include an elementary semiconductor (such as crystal silicon, polycrystalline silicon, amorphous silicon and germanium), a compound semiconductor (such as silicon carbide and gallium arsenide), an alloy semiconductor (such as silicon germanium, gallium arsenide phosphide, aluminum indium arsenide, aluminum gallium arsenide and gallium indium phosphide), combinations thereof and/or other materials. Substrate 102 may also include a semiconductor material on an insulator, such as a silicon-on-insulator (SOI) substrate, a silicon on sapphire (SOS) substrate, or a thin film transistor (TFT). In one embodiment, substrate 102 may also include a doped epitaxial layer. Substrate 102 may also include a multiple silicon structure or a multilayer, compound semiconductor structure.

Located on substrate 102 are a P-well region 104 and a N-well region 106. P-well region 104 and N-well region 106 may be part of substrate 102, and formed by implantation. Alternatively, P-well region 104 and N-well region 106 may be an epi layer such as a Si epi layer formed by epi processing. P-well region 104 has a p-dopant such as Boron, and N-well region 106 has an n-dopant such as phosphorus. In one embodiment, well regions 104 and 106 can be formed by growing a sacrificial oxide on substrate 102, opening a pattern for the location of the N-well or P-well, and using a chained-implantation procedure, as is known in the art.

There might be an insulator layer (not shown) between substrate 102 and overlying P-well 104 and N-well regions 106. In one embodiment, the insulator layer may be a buried oxide (BOX) layer, such as that formed by separation by implantation of oxygen (SIMOX) technology, or wafer bonding. The insulator layer may also be formed over the substrate 102 by thermal oxidation, atomic layer deposition (ALD), chemical vapor deposition (CVD), physical vapor deposition (PVD) and/or other processes. Chemical mechanical polishing (CMP) and/or other methods may be employed to attain a desired thickness of the insulator layer. Moreover, although not limited by the scope of the present disclosure, the insulator layer may include oxide, silicon oxide, silicon nitride, silicon oxynitride, hafnium oxide, zirconium oxide, aluminum oxide, a hafnium dioxide-alumina ($HfO_2$—$Al_2O_3$) alloy, combinations thereof and/or other materials.

P-well region 104 includes on its surface a source region 108 and a body contact feature 110 adjacent the source region 108. Source region 108 includes source ends 112 and 114 located opposite each other. Body contact feature 110 includes body contact ends 116 and 118 located opposite each other. N-well region 106 includes on its surface a drain region 120. Drain region 120 includes drain ends 122 and 124 located opposite each other. In one embodiment, source region 108 and drain region 120 are source/drain regions of a metal-oxide-semiconductor field-effect-transistor (MOSFET) or other type of transistor such as lateral diffused MOS (LDMOS), or vertical diffused MOS (VDMOS). Accordingly, source region 108 and drain region 120 may be doped with a p-type impurity (such as boron) and/or an n-type impurity (such as phosphorous). The source and drain for a MOSFET may be formed by ion implantation and/or diffusion. A rapid thermal annealing (RTA) step may be used to activate the implanted dopants. The source and drain may have different doping profiles formed by multi-step implantation. Also, the source and drain may have different structures, such as raised, recessed, or strained. Body contact feature 110 may function as a guard ring in a high power MOS device. Body contact feature 110 may be p-type doped with higher concentration of p-type impurity (such as boron) to provide a contact for connecting P-well region 104.

Source region 108, body contact feature 110, and drain region 120 are each substantially of width $W_1$, and located on device 100 such that source end 114, body contact end 118, and drain end 124 all lie along a line 126, and source end 112, body contact end 116, and drain end 122 all lie along a line 128. Source region 108, body contact feature 110, and drain region 120 occupy a region between lines 126 and 128, with the region outside of lines 126 and 128 defined as a non-active region.

A gate electrode 130 is located above P-well region 104 and N-well region 106. Gate electrode is of width $W_g$, and exists in the region between lines 126 and 128 while also extending out into the non-active region beyond lines 126 and 128. Gate electrode 130 may be formed by many methods, including but not limited to CVD, PVD, silicidation, plating, and ALD. The gate electrode may have multi-layer structure, such as doped polysilicon layer, and/or a layer of metal such as Ti, Ta, TiN, TaN, NiSi, and CoSi. The gate electrode may include more processing during formation such as implant doping for polysilicon, or annealing for silicidation.

Figure 2:
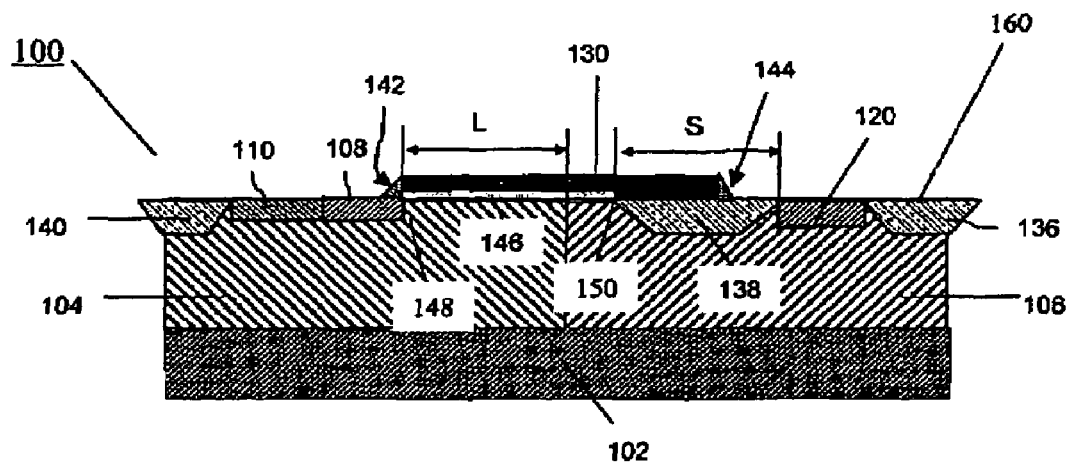
FIG. 2 is a cross-sectional view of the embodiment of the high voltage semiconductor device of FIG. 1 taken along section line 2—2.

Referring to FIG. 2, which is a cross sectional view of the embodiment of FIG. 1 taken along dotted line 132, device 100 includes an isolation feature 136 and 138 located in N-well region 106. Isolation feature 138 has length S. An isolation feature 140 is also located in P-well region 104. Isolation features 136, 138, and 140 may utilize isolation technology such as local oxidation of silicon (LOCOS) and shallow trench isolation (STI). In one embodiment, the depth of isolation features 136, 138, and 140 is less than approximately 0.5 µm as measured vertically from a surface 160, depending on the device technology. LOCOS may include thermal oxidation using a patterned mask layer. STI may include dry etching a trench in a substrate and filling the trench by insulator materials such as silicon oxide, silicon nitride, or silicon oxynitride. The trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

Semiconductor device 100 includes a pair of spacers 142 and 144 adjacent to gate electrode 130 as shown. Spacers 142 and 144 are positioned on both sides of the gate electrode 130, and may include a dielectric material such as silicon nitride, silicon oxide, silicon carbide, silicon oxynitride, or combinations thereof. Spacers 142 and 144 may be formed by depositing dielectric material and then dry-etching.

Semiconductor device 100 further includes a gate dielectric 146 adjacent to gate electrode 130. The gate electrode 130 may extend from a source edge 148 of source region 108 to a region above isolation feature 138 as shown. In one embodiment, gate dielectric 146 may extend from source edge 148 of source region 108 to an isolation edge 150 of isolation feature 138. The gate length L is defined as the portion of gate electrode 130 which exists over P-well region 104. Gate dielectric materials may include silicon oxide, silicon oxynitride, or a high k dielectric, such as hafnium oxide, hafnium silicide, hafnium silicon oxide, hafnium silicon oxynitride, zirconium oxide, aluminum oxide, a hafnium dioxide-alumina ($HfO_2$—$Al_2O_3$) alloy, silicon nitride, Tantalum pentoxide or combinations thereof. Gate dielectric 146 may be formed by thermal oxide, ALD, CVD, or PVD. The gate dielectric may have multi-layer structure, such as first layer of Silicon oxide by thermal oxidation, and a second layer of high K material. The gate dielectric 146 may include more processing during formation such as nitrogen treatment of thermal oxide layer, and/or annealing of the gate dielectric stack including both silicon oxide and a high K layer.

Semiconductor device features including drain region 120, source region 108, body contact feature 110, and gate electrode 130 may be connected to an overlying interconnects structure (not shown) through low resistant interfaces such as metal silicide including silicide, cobalt silicide, tungsten silicide, titanium silicide, and tantalum silicide.

Referring back to FIG. 1, semiconductor device 100 includes a deep trench structure 152 and 154. Deep trench structure 152 is located parallel to line 126, and a distance $W_2$ from it and source end 114, body contact end 118, and drain end 124. Deep trench structure 154 is located parallel to line 128, and a distance $W_3$ from it and source end 112, body contact end 116, and drain end 122.

Figure 3:
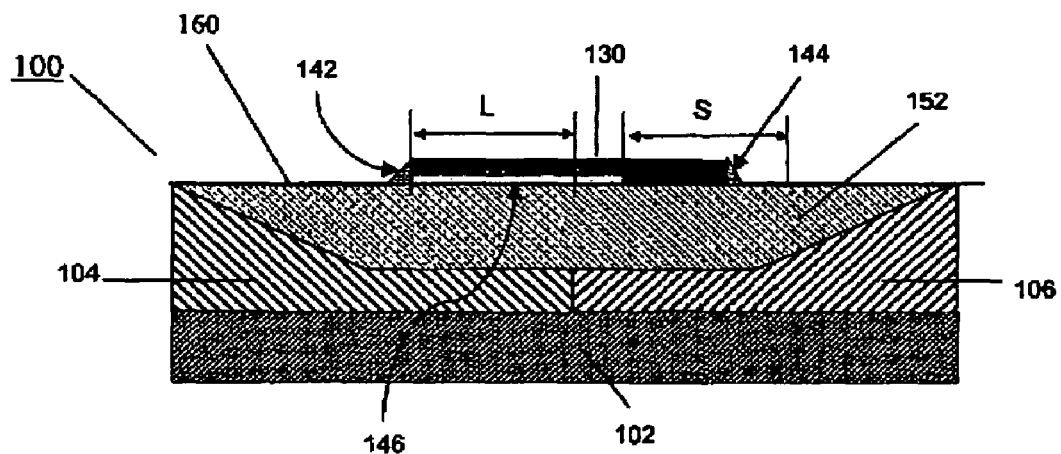
FIG. 3 is a cross-sectional view of the embodiment of the high voltage semiconductor device of FIG. 1 taken along section line 3—3.

FIG. 3 is a cross sectional view of the embodiment of FIG. 1 taken along the dotted line 156, and shows the deep trench structure 152 which extends to a depth greater than that of isolation features 136, 138 and 140 in FIG. 2. The depth of the deep trench isolation (DTI) structure 154 may vary from approximately 0.5 µm to approximately 5 µm, as measured vertically from a top surface 160, depending on the device technology. The depth of DTI structure 154 (cross section not shown) may also vary from approximately 0.5 µm to approximately 5 µm, as measured vertically from the top surface 158, depending on the device technology. The DTI structures typically have a thickness more than approximately 1 µm.

The DTI structure may be created using a process sequence such as: forming a high aspect ratio trench by patterning an opening using photoresist and masking, etching a trench in the semiconductor substrate by dry etching, wet etching, or a multi-step combination thereof, optionally forming at least one layer of trench liner to improve a trench interface, filling the trench with dielectric material such as silicon oxide by CVD, and using CMP or etch-back to remove the excess of dielectric material above the substrate. In another embodiment, filled materials can be a plurality of dielectric materials having a multiple-layer structure. One of those filled materials can even be a air, resulting in an air gap as part of the deep trench structure. In another embodiment, a part of the trench may be filled by semiconductor material which is isolated by dielectric liner layer(s). The semiconductor layer may be silicon formed by epi growth from silicon substrate in the bottom of the trench opening.

In one embodiment, gate length L is about 3 µm and the length S of isolation feature 138 is approximately 3 µm. $W_2$ and $W_3$ may be chosen as approximately 0.5 µm. In this configuration, the non-ideal channel existing in the non-active region outside of lines 126 and 128 is electrically cut off by the DTI structure. Only the portion of the non-ideal channel, which exists from line 126 and 128 to the closest edge of their respective deep trench structures 152 and 154, will allow a leakage current to flow through it when a high voltage is applied to the gate. Since $W_2+W_3$, the non-ideal channel, is small relative to $W_1$, the ideal channel, relatively very little leakage current exists, and hence non-linear current-vs.-voltage responses in the device are substantially eliminated.

The DTI structures may have a different cross-sectional profiles, including such a profile with straight, tilted, or curved sidewalls, depending on the device technology. A curved sidewall profile may have a larger diameter or a smaller diameter at the top opening of the trench as compared with that of the bottom opening of the trench.

Figure 4:
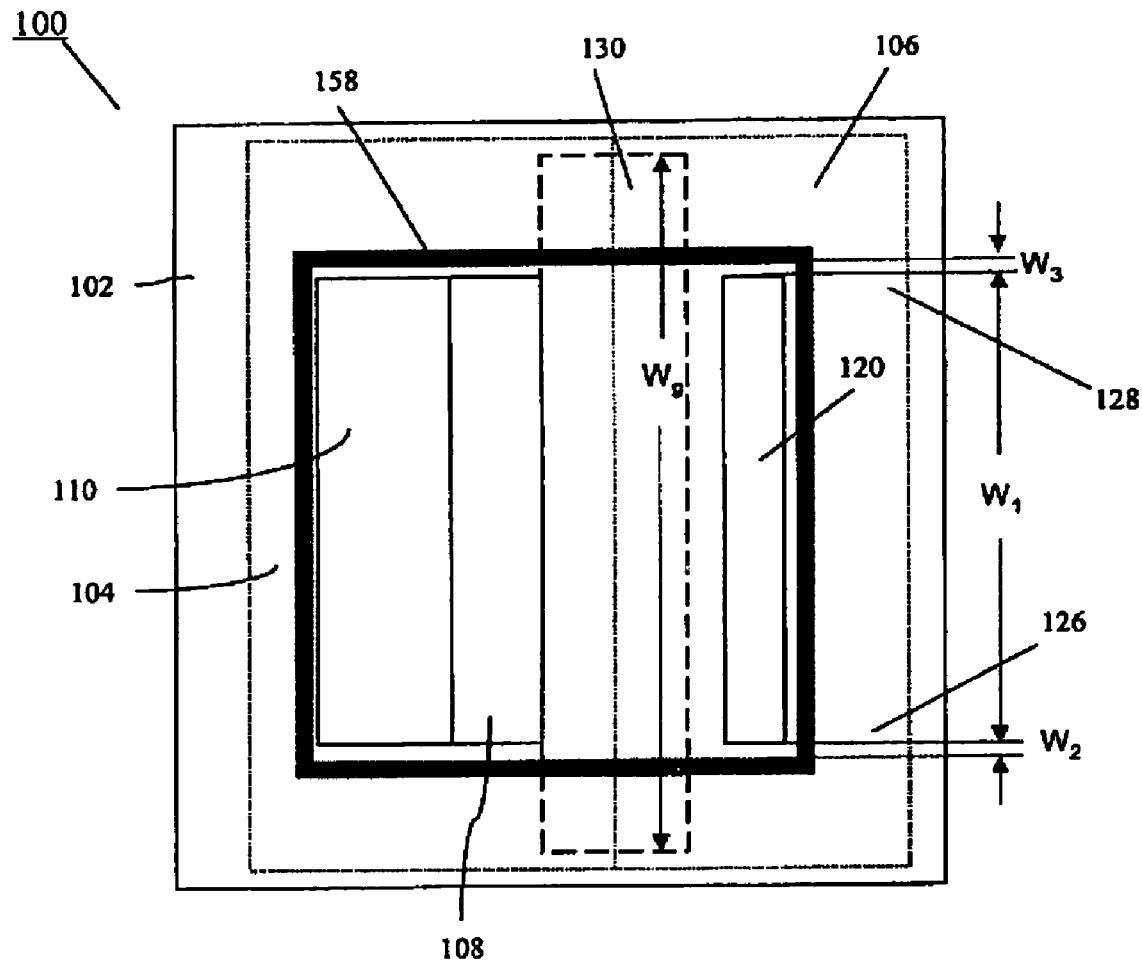
FIG. 4 is a top view illustrating another embodiment of a high voltage semiconductor device constructed according to aspects of the present disclosure.

The DTI structures may have different patterns according to design and fabrication considerations. In one embodiment, the DTI structures have two-straight-line patterns such as the deep trench structures 152 and 154, as shown in FIG. 1. In another embodiment, the DTI structures may be angled trenches, broken or non-continuous trenches, or trenches in a closed pattern. A closed deep trench structure 158, like the one shown in FIG. 4, may partially underlay a plurality of portions of gate electrode 130 extended beyond the edge of lines 126 and 128, and encircle the device. Such an embodiment will additionally allow semiconductor device 100 to be isolated from neighboring devices (not shown) when the high voltages applied to it might cause currents among neighboring devices otherwise.

Further embodiments may also provide a transistor device. Transistor devices include, but are not limited to, LDMOS, VDMOS, other types of high power MOS transistors, Fin structure field effect transistors (FinFET), and strained MOS structures.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present discloser, and that they may make various changes, substitutions and alterations herein without departing from the spirit and scope of the present disclosure.

What is claimed is:

1. A semiconductor device comprising:
   a substrate including a source and drain, the source having a first edge and the drain having a first edge;
   a gate between the source and drain, the gate having a first portion;
   a first deep trench structure located directly under the first portion of the gate viewed in a direction from the gate to the substrate, and proximate to the first edge of the source and the first edge of the drain, wherein the first deep trench structure has a depth greater than 0.5 µm;
   a neighboring semiconductor device; and
   a first shallow trench isolation structure located between the semiconductor device and the neighboring semiconductor device.

2. The semiconductor device of claim 1 further comprising:
   a second shallow french isolation structure adjacent to the drain wherein the drain is situated between the first shallow trench isolation structure and the second shallow trench isolation structure.

3. The semiconductor device of claim 2 wherein the gate is extended to partially overlay the second shallow trench isolation structure.

4. A semiconductor device comprising:
   a substrate including a source and drain, the source having a first edge and the drain having a first edge;
   a gate electrode on the substrate and between the source and drain, a first portion of the gate electrode extending past the first edge of the source and the first edge of the drain;
   a first deep trench structure located directly under the first portion of the gate electrode viewed in a direction from the gate electrode to the substrate and proximate to the first edge of the source and the first edge of the drain, wherein the first deep trench structure has a depth greater than 0.5 µm;
   a neighboring semiconductor device; and
   a first shallow trench isolation structure located between the semiconductor device and the neighboring semiconductor device.

5. The semiconductor device of claim 4 further comprising:
   a second shallow trench isolation structure adjacent to the drain wherein the drain is situated between the first shallow trench isolation structure and the second shallow trench isolation structure.

6. The semiconductor device of claim 5 wherein the gate is extended to partially overlay the second shallow trench isolation structure.

7. A semiconductor device comprising:
   a substrate having a source and drain, having widths that are substantially equal and each having a first edge substantially located along a common line on the substrate;
   a gate electrode on the substrate and between the source and the drain, the gate electrode having a first portion extending past the first edge of the source and the first edge of the drain;
   a first deep trench structure located directly under the first portion of the gate electrode viewed in a direction from the gate electrode to the substrate, the first deep trench structure parallel to the common line on the substrate and proximate to the first edge of the source and the first edge of the drain, wherein the first deep trench structure is substantially deeper than 0.5 µm;
   a neighboring semiconductor device; and
   a first shallow trench isolation structure between the semiconductor device and the neighboring semiconductor device.

8. The semiconductor device of claim 7 further comprising:
   a second shallow french isolation structure adjacent to the drain wherein the drain is situated between the first shallow trench isolation structure and the second shallow trench isolation structure.

9. The semiconductor device of claim 8 wherein the gate is extended to partially overlay the second shallow trench isolation structure.

* * * * *